United States Patent [19]

Tabata et al.

[11] Patent Number: 4,914,540
[45] Date of Patent: Apr. 3, 1990

[54] OVERVOLTAGE-PROTECTIVE DEVICE

[75] Inventors: Mituharu Tabata; Gourab Majumdar, both of Itami, Japan

[73] Assignee: Mitsubishi Denki Kabushiki Kaisha, Tokyo, Japan

[21] Appl. No.: 148,717

[22] Filed: Jan. 26, 1988

[30] Foreign Application Priority Data

Feb. 12, 1987 [JP] Japan .................................. 63-30028

[51] Int. Cl.⁴ ............................................. H02H 3/20
[52] U.S. Cl. ........................................ 361/91; 361/56
[58] Field of Search .................... 361/56, 86, 91, 111, 361/117–119, 6, 8, 13

[56] References Cited

U.S. PATENT DOCUMENTS

| | | | |
|---|---|---|---|
| 4,323,942 | 4/1982 | Hartman et al. | 361/56 |
| 4,449,158 | 5/1984 | Taira | 361/91 |
| 4,546,401 | 8/1985 | Suedberg | 361/91 |
| 4,630,162 | 12/1986 | Bell et al. | 361/56 |
| 4,658,320 | 4/1987 | Hougel | 361/13 |
| 4,739,437 | 4/1988 | Morgan | 361/91 X |
| 4,745,511 | 5/1988 | Kugelman et al. | 361/13 X |

FOREIGN PATENT DOCUMENTS

| | | |
|---|---|---|
| 2148445 | 9/1971 | Fed. Rep. of Germany . |
| 3145592 | 7/1982 | Fed. Rep. of Germany . |
| 3537419 | 4/1987 | Fed. Rep. of Germany ........ 361/91 |

OTHER PUBLICATIONS

"Application of High Voltage Darlington Transistors in AC Motor Controls", CH 1817-6/82/0000-0736s00.-75 © 1982 IEEE, pp. 736-740.

Hitachi Power MOS FET Data Book, May 1985, pp. 16-19.

"Snubbers for Pulse Width Modulated Bridge Converters with Power Transistors or GTOs", IPEC-Tokyo '83, pp. 313-323.

Protection of Power Mosfets From Transcient Overvoltages J. Tihanyi pp. 56-57, 1985.

*Primary Examiner*—Derek S. Jennings
*Attorney, Agent, or Firm*—Oblon, Spivak, McClelland, Maier & Neustadt

[57] ABSTRACT

Voltage-dividing resistors, being connected in parallel to a switching element to be protected, create control voltage which is responsive to voltage applied to the switching element, to supply the same to a gate of a field effect transistor. The field effect transistor is connected in parallel to the switching element, to conduct when the control voltage exceeds a threshold value for passing overvoltage absorbing current, while causing high-frequency shorting across the switching element by its parasitic capacitance.

3 Claims, 2 Drawing Sheets

OVERVOLTAGE-PROTECTIVE DEVICE

BACKGROUND OF THE INVENTION

1. Field of the Invention

The present invention relates to an overvoltage-protective device for protecting a device such as a switching element against excessive voltage.

2. Description of the Prior Art

FIG. 1 is a circuit diagram showing a conventional overvoltage-protective device for a switching element S. This overvoltage-protective device, which is called a snubber circuit, is adapted to suppress abrupt rising voltage applied to the switching element S or absorb surge voltage. The switching element S formed by a power MOS or an IGBT (insulated gate bipolar transistor), for example, is adapted to switch current supplied to a high-voltage/high-current load such as a motor for PWM control, etc. Symbol A denotes a load circuit such as the motor, which serves as an overvoltage applying circuit applying excessive voltage to the switching element S for the reason that an unneglectable reactance component is present in a switch path of the switching element S or a motor or the like serves as a surge voltage source.

The overvoltage-protective device includes a diode 1, a capacitor 2 and a resistor 3 and is connected across terminals T1 and T2, which are drawn out across the switching element S. The capacitor 2 is adapted to absorb excessive voltage, and is charged at a high speed through function of the diode 1 which bypasses the resistor 3. The resistor 3 is adapted to discharge the capacitor 2 with an appropriate time constant.

When the switching element S is switched in a relatively low frequency range, the capacitor 2 functions as large resistance against a low frequency component, and hence value of current flowing through the capacitor 2 by charge/discharge thereof is relatively small. Discharge current through the resistor 3 is small in discharge, i.e., in an off state of the switching element S. Therefore, no disadvantage takes place to prevent a switching operation of the switching element S by, e.g., current continuously flowing to the load although the switching element S is turned off.

When surge voltage SG of high frequency component shown by a dotted line in FIG. 2 is applied to the switching element S, the capacitor 2 shows small resistance value with respect to a high frequency component, and hence the surge voltage SG is charged and absorbed by the capacitor 2 as overvoltage absorbing current I. A oblique line portion in FIG. 2 shows energy absorbed by the capacitor 2, and a solid line shows voltage actually applied to the switching element S. The charged capacitor 2 is slowly discharged through the resistor 3 after termination of the surge voltage SG, whereas influence by such discharge is small and not shown in FIG. 2.

Thus, the both ends of the switching element S are coupled in an AC manner by the diode 1 and the capacitor 2, to be shorted with respect to a high frequency component such as the surge voltage SG. A line S1 in FIG. 3 shows flowability of overvoltage absorbing current I responsive to a frequency of overvoltage such as surge voltage applied to the switching element S. Symbol SF denotes a frequency range in which the switching element S is switched. The overvoltage absorbing current I hardly flows in the switching frequency range SF so that the overvoltage-protective device exerts no influence on normal switching operation of the switching element S. A curve S2 shows absolute value of discharge current of the capacitor 2.

In the conventional overvoltage-protective device as hereinabove described, charge/discharge of the capacitor 2 is repeated through the diode 1 and the resistor 3 every time the switching element S is switched. Although the charge/discharge current is relatively small as hereinabove described, power loss accumulated in the diode 1 and the resistor 3 is unneglectably increased by such repetition. In order to effectively protect the switching element S against excessive voltage of a relatively low frequency, i.e., excessive voltage having relatively wide pulse width, it is necessary to increase capacitance value of capacitor 2 so that the overvoltage absorbing current I readily flows even if the frequency component is relatively low and amount of surge absorption is increased. In this case, however, a relatively large amount of the overvoltage absorbing current I flows in the switching frequency range SF shown in FIG. 6 of the switching element S, to prevent normal switching operation of the switching element S.

The capacitor 2 preferably have capacitance value as large as possible within a range not causing the aforementioned inconvenience, in order to improve the excessive voltage absorbing characteristic to the utmost. Further, the resistor 3 must be one for high power, in order to prevent destruction through heat generation caused by repeated charge/discharge of the capacitor 2. Such capacitor 2 and resistor 3 are prepared by discrete components since it is difficult to be formed as a monolithic IC, and hence the device cannot be reduced in size.

SUMMARY OF THE INVENTION

The present invention is directed to an overvoltage-protective device for protecting a device to be protected, which is applied with a signal of an arbitrary frequency, against excessive voltage.

According to the present invention, an overvoltage-protective device comprises means for providing a control signal having voltage value responsive to that of a signal applied to a device to be protected; and an enhancement field effect transistor which is connected in parallel to the device to be protected, the transistor having a control electrode applied with the control signal to conduct when the voltage value of the control signal is in excess of prescribed value for passing overvoltage absorbing current, and having parasitic capacitance so that a signal component having a frequency sufficiently higher than the arbitrary frequency is bypassed through the transistor.

In a preferred embodiment of the present invention, the means for providing the control signal is formed by voltage-dividing resistors of relatively high resistance values, which are connected in parallel to the device to be protected.

Accordingly, a principal object of the present invention is to provide an overvoltage-protective device which can absorb excessive voltage of a relatively low frequency, i.e., having relatively large pulse width, without exerting bad influence on operation of the device to be protected.

Another object of the present invention is to provide an overvoltage-protective device which can be formed as a monolithic IC, and which can be reduced in size even if the same is formed as a hybrid IC through use of discrete parts.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
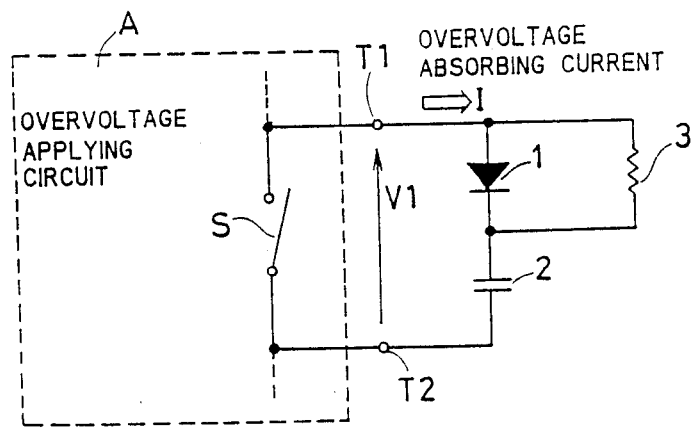
FIG. 1 is a circuit diagram showing a conventional overvoltage-protective device.
Figures 2, 3:
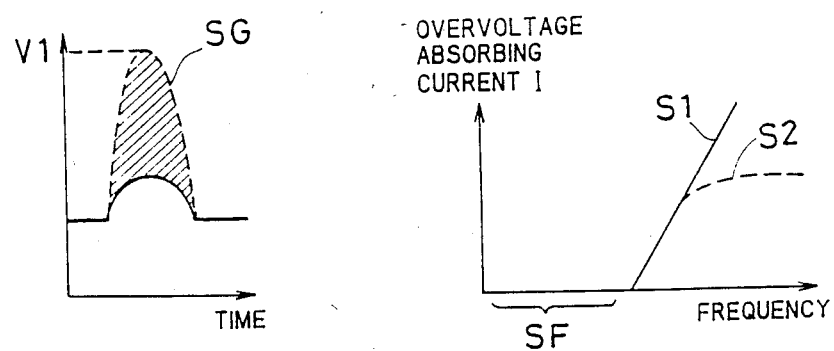
FIG. 2 is a graph showing surge voltage and voltage actually applied to a switching element in the conventional overvoltage-protective device.
FIG. 3 is a graph showing a characteristic of overvoltage absorbing current to frequency in the conventional overvoltage-protective device.
Figure 4:
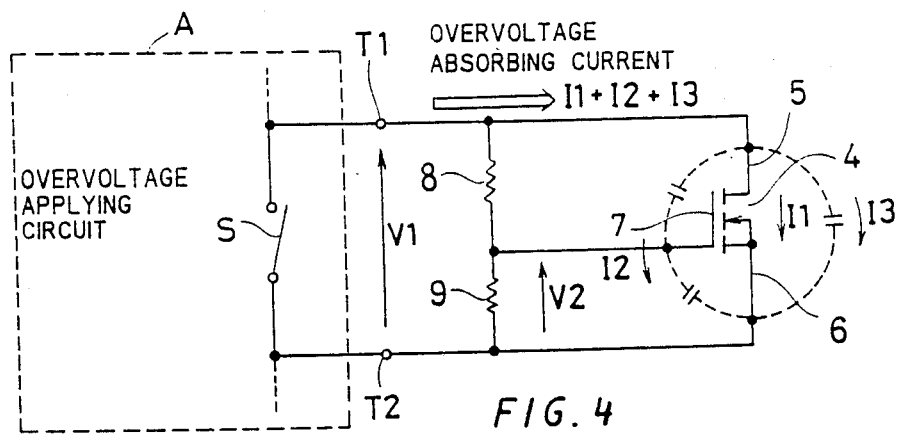
FIG. 4 is a circuit diagram showing an embodiment of an overvoltage-protective device according to the present invention.

FIG. 4 is a circuit diagram showing an embodiment of an overvoltage-protective device according to the present invention. The overvoltage-protective device comprises an N-channel enhancement MOS field effect transistor 4 and voltage-dividing resistors 8 and 9. The voltage-dividing resistors 8 and 9 are connected in series across terminals T1 and T2 drawn out across a switching element S, to derive voltage V2 from a node between the same by dividing voltage V1 placed across the terminals T1 and T2, i.e., voltage applied to the switching element S in an appropriate ratio. The voltage-dividing resistors 8 and 9 are prepared by those having relatively high resistance values, so that current hardly flows in a path through the voltage-dividing resistors 8 and 9. The transistor 4 has a drain 5 connected to the terminal T1, a source 6 connected to the terminal T2 and a gate 7 connected to the node between the resistors 8 and 9. Thus, the gate 7 of the transistor 4 is applied with the voltage V2 obtained by dividing the voltage V1 applied to the switching element S, which is a device to be protected, by the voltage-dividing resistors 8 and 9, so that a current path for bypassing the switching element S to be protected is defined across the terminals T1 and T2 upon conduction of the transistor 4.

The N-channel enhancement MOS field effect transistor 4 conducts across the drain 5 and the source 6 when the gate 7 has a positive potential exceeding a value (threshold value) with respect to the source 6. As the voltage V1 applied to the switching element S to be protected is increased, the voltage V2 divided by the resistors 8 and 9 is raised and hence voltage across the gate 7 and the source 6 is also increased. When the gate-to-source voltage exceeds the threshold value, the transistor 4 conducts. Thus, bypass current across the terminals T1 and T2 flows through the transistor 4, so that the voltage V1 applied to the switching element S is reduced. When the voltage V1 applied to the switching element S becomes lower than prescribed limitation voltage, the voltage V2 divided by the voltage dividing resistors 8 and 9 also drops to be lower than the threshold value, whereby the transistor 4 becomes nonconductive.

Through the aforementioned operation, the voltage V1 applied to the switching element S is limited. In the case of high-speed voltage change over speed limitation of ON-OFF control action of the transistor 4, i.e., in the case of surge voltage of a high frequency component, high-frequency shorting is caused across the drain 5 and the source 6 by parasitic capacitance of the transistor 4, whereby such surge voltage is sufficiently absorbed.

Figure 5:
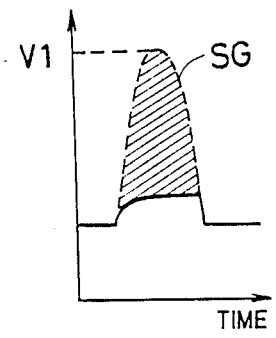
FIG. 5 is a graph showing surge voltage and voltage actually applied to a switching element in the overvoltage-protective device according to the present invention.
Figure 6:
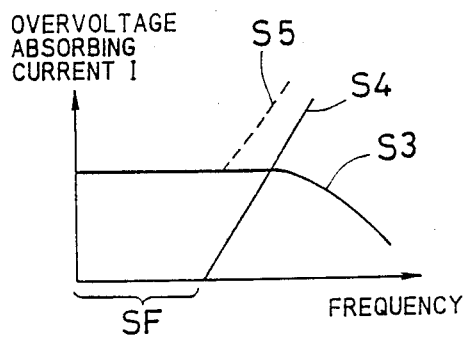
FIG. 6 is a graph showing a characteristic of overvoltage absorbing current to frequency in the overvoltage-protective device according to the present invention.

When, for example, the surge voltage SG shown by a broken line in FIG. 5 is applied to the switching element S, the divided voltage V2 applied to the gate 7 of the transistor 4 is so raised that the transistor 4 conducts when the voltage V2 exceeds the threshold value, whereby overvoltage absorbing current I1+I2+I3 flows through the transistor 4. Thus, the voltage V1 applied to the switching element S is limited, to become as shown by a solid line in FIG. 5. The current I1 flows by conduction of the transistor 4, as shown by a curve S3 in FIG. 6. FIG. 6 shows overvoltage absorbing current I with respect to an overvoltage frequency on condition that overvoltage is constant. The current I2 +I3 forming the overvoltage absorbing current I flows through parasitic capacitance of the transistor 4, as shown by a curve S4 in Fig. 6. The current I2 +I3 causes high-frequency shorting across the terminals T1 and T2, similarly to the conventional case, whereby the surge voltage of high frequency is effectively absorbed. Curve S5 in FIG. 6 shows composite overvoltage absorbing current I1 +I2 +I3.

According to the above embodiment, the transistor 4 conducts when the overvoltage exceeds the prescribed limitation voltage regardless of the frequency of the overvoltage applied to the switching element S as shown in FIG. 6, so that the overvoltage absorbing current I flows through the transistor 4. Namely, even if the overvoltage has relatively long pulse width included in the switching frequency range SF of the switching element S, the overvoltage absorbing current I flows to protect the switching element S when the overvoltage exceeds the limitation voltage. As a matter of course, the transistor 4 will not conduct within a range of voltage applied to the switching element S in normal operation, and hence no overvoltage absorbing current I flows during the normal operation, not to prevent switching operation of the switching element S.

Figure 7:
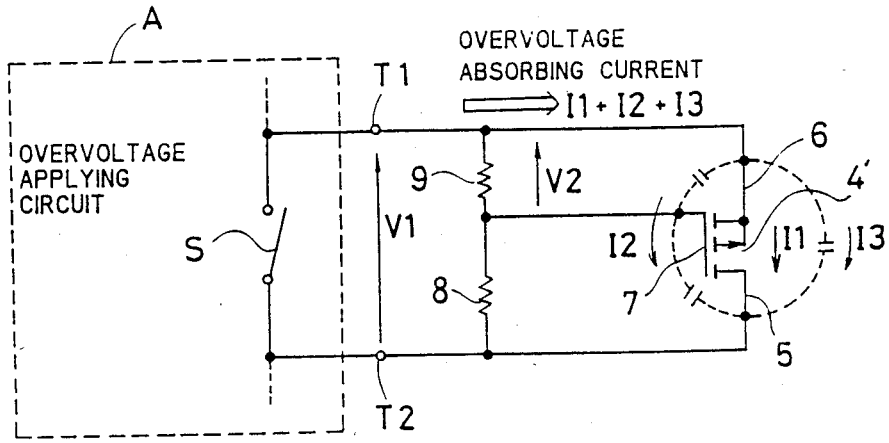
FIG. 7 is a circuit diagram showing another embodiment of the overvoltage-protective device according to the present invention.

FIG. 7 is a circuit diagram showing another embodiment of the overvoltage-protective device according to the present invention. In this embodiment, the N-channel enhancement MOS field effect transistor 4 shown in FIG. 4 is replaced by a P-channel enhancement MOS field effect transistor 4'. A source 6 of the transistor 4' and a voltage-dividing resistor 9 are connected to a terminal T1, and a drain of the transistor 4' and a voltage-dividing resistor 8 are connected to a terminal T2. Also in this embodiment, the transistor 4' conducts when voltage V1 applied to a switching element S is so increased that divided voltage V2 exceeds a threshold value, whereby overvoltage absorbing current I flows to protect the switching element S. Parasitic capacitance of the transistor 4' causes high-frequency shorting across the terminal T1 and T2, so that surge voltage of high frequency is effectively absorbed similarly to the embodiment illustrated in FIG. 4.

In each of the above embodiments, the resistance values of the voltage-dividing resistors 8 and 9 are relatively large and substantially no current flows through the voltage-dividing resistors 8 and 9. Further, the transistors 4 and 4' do not conduct when no overvoltage is present. Thus, the aforementioned overvoltage-protective device has extremely small power consumption in the case other than overvoltage absorption. Heat generation by current may not be taken into consideration with respect to the resistors 8 and 9, and the transistors 4 and 4' may simply withstand possible overvoltage. Thus, these elements can be formed on a monolithic IC. Further, the device can be reduced in size when the components are assembled into a hybrid IC as discrete components.

The voltage-dividing resistors 8 and 9 are adapted to divide the voltage V1 applied to the switching element S in an appropriate ratio to create the divided voltage V2 responsive to the voltage V1 and supply the same to the gate of the transistors 4 and 4' as a control signal, while such resistors 8 and 9 may be replaced by other appropriate means for deriving a control signal having voltage value which is responsive to the voltage V1 applied to the switching element S.

Although each of the above embodiments has been described with reference to the case of protecting the switching element S, which is switched in the arbitrary switching frequency range SF, against overvoltage, the overvoltage-protective device according to the present invention can be generally applied to the case of protecting a device to be protected, to which a signal of an arbitrary frequency is applied, against overvoltage. Even if the overvoltage is within a frequency range close to the arbitrary frequency, the device to be protected can be effectively protected against the overvoltage without disadvantageous influence on normal operation thereof, since whether or not overvoltage absorbing current flows does not depend on the frequency of the overvoltage but on whether or not the voltage level of the overvoltage exceeds limitation voltage. Thus, the device to be protected can be effectively protected against the overvoltage of all frequencies.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An overvoltage-protective device for protecting a device to be protected, being applied with a signal of an arbitrary frequency, against overvoltage, said overvoltage-protective device comprising:
    means for providing a control signal of voltage value responsive to that of said signal applied to said device to be protected, said means for providing said control signal including voltage-dividing resistors of relatively high resistance values connected in parallel to said device to be protected; and
    an enhancement field effect transistor which is connected in parallel to said device to be protected, said transistor having a control electrode applied with said control signal to conduct when said voltage value of said control signal is in excess of prescribed value for passing overvoltage absorbing current and having parasitic capacitance so that a signal component of a frequency sufficiently higher than said arbitrary frequency is bypassed through said transistor;
    wherein said device to be protected includes a switching element which performs switching operation at said arbitrary frequency.

2. An overvoltage-protective device for protecting a switching element against overvoltage, said overvoltage-protective device comprising:
    means for providing a control signal of voltage value responsive to that of a signal applied to said switching element, said means for providing said control signal including voltage-dividing resistors of relatively high resistance values connected in parallel to said switching element; and
    an enhancement field effect transistor which is connected in parallel to said switching element, said transistor having a control electrode applied with said control signal to conduct when said voltage value of said control signal is in excess of prescribed value for passing overvoltage absorbing current and having parasitic capacitance so that a signal component of a relatively high frequency is bypassed through the transistor;
    wherein said switching element is switched at a frequency lower than that of said signal component bypassed by said parasitic capacitance of said field effect transistor.

3. An overvoltage-protective device for protecting a device to be protected, comprising:
    two input terminals connected to terminals of said device to be protected;
    an enhancement field effect transistor having three terminals, two of said three terminals being connected to said two input terminals;
    two voltage dividing resistors, each having one terminal in common and one terminal connected to one of said input terminals;
    said terminal in common being connected to the third terminal of said field effect transistor.

* * * * *